(12) United States Patent
Zeng et al.

(10) Patent No.: US 11,462,430 B2
(45) Date of Patent: Oct. 4, 2022

(54) CERAMIC-CIRCUIT COMPOSITE STRUCTURE AND METHOD FOR MAKING THE SAME

(71) Applicant: Hong Chuang Applied Technology Co., Ltd, Zhubei (TW)

(72) Inventors: Yan-Kai Zeng, Zhubei (TW); Bai-Xuan Jiang, Zhubei (TW)

(73) Assignee: HONG CHUANG APPLIED TECHNOLOGY CO., LTD, Zhubei (TW)

( * ) Notice: Subject to any disclaimer, the term of this patent is extended or adjusted under 35 U.S.C. 154(b) by 290 days.

(21) Appl. No.: 16/704,604

(22) Filed: Dec. 5, 2019

(65) Prior Publication Data

US 2020/0294837 A1    Sep. 17, 2020

(30) Foreign Application Priority Data

Mar. 12, 2019   (TW) .................. 108108306

(51) Int. Cl.
*H01L 21/683* (2006.01)
*H05K 3/46* (2006.01)

(52) U.S. Cl.
CPC ....... *H01L 21/6833* (2013.01); *H05K 3/4629* (2013.01)

(58) Field of Classification Search
CPC ........... H01L 21/6833; H01L 21/68785; H01L 21/67103; H05K 1/0284; H05K 1/0306; H05K 3/0014; H05K 3/12; H05K 3/4629
USPC ....................................................... 361/234
See application file for complete search history.

(56) References Cited

U.S. PATENT DOCUMENTS

| | | | |
|---|---|---|---|
| 6,316,116 B1 * | 11/2001 | Nakamura | C04B 41/5133 156/89.15 |
| 2002/0162630 A1 * | 11/2002 | Satoh | H01L 21/68735 118/728 |
| 2004/0011287 A1 * | 1/2004 | Ootsuka | C23C 16/4581 118/500 |

(Continued)

FOREIGN PATENT DOCUMENTS

| | | | | |
|---|---|---|---|---|
| DE | 102012212465 B3 * | 11/2013 | ......... | H01L 21/6833 |
| EP | 493089 A1 * | 7/1992 | ....... | H01L 21/67103 |

(Continued)

OTHER PUBLICATIONS

Machine translation of Muramatsu et al. Japanese Patent Document JP 2002015840 A Jan. 18, 2002 (Year: 2002).*

*Primary Examiner* — Kevin J Comber
(74) *Attorney, Agent, or Firm* — Muncy, Geissler, Olds & Lowe, P.C.

(57) ABSTRACT

The present invention provides a ceramic-circuit composite structure, comprising: a ceramic plate with a supporting surface that has a recessed supporting portion; a curved-surface circuit buried in the ceramic plate; and a power supply module electrically connected to the curved-surface circuit. Moreover, the present invention provides a method for making the ceramic-circuit composite structure. The ceramic-circuit composite structure of the present invention makes use of the curved-surface circuit to improve the prior art problem that a planar circuit has less static electricity or lower temperature at the center than in the peripheral region.

12 Claims, 13 Drawing Sheets

(56) References Cited

U.S. PATENT DOCUMENTS

| | | | |
|---|---|---|---|
| 2013/0319854 A1* | 12/2013 | Parkhe | H01J 37/32577 |
| | | | 204/298.06 |
| 2014/0048751 A1* | 2/2014 | Arancio | C08L 35/04 |
| | | | 252/514 |
| 2018/0082866 A1* | 3/2018 | Alayavalli | H01L 21/67248 |
| 2020/0185249 A1* | 6/2020 | Rice | H01L 21/68785 |

FOREIGN PATENT DOCUMENTS

| | | | |
|---|---|---|---|
| JP | 06302678 A | * | 10/1994 |
| JP | H06302678 A | * | 10/1994 |
| JP | 2002015840 A | * | 1/2002 |
| JP | 2008182129 A | * | 8/2008 |

* cited by examiner

CERAMIC-CIRCUIT COMPOSITE STRUCTURE AND METHOD FOR MAKING THE SAME

BACKGROUND OF THE INVENTION

1. Technical Field

The present invention relates to a ceramic-circuit composite structure and more particularly to a ceramic-circuit composite structure for use in a semiconductor manufacturing process.

2. Description of Related Art

In the fields of electronics and semiconductor technology, high-precision manufacturing processes are typically required. These processes are so precise that product quality not only depends on the starting materials and manufacturing conditions, but may also be affected by the components of the manufacturing equipment.

For example, the manufacturing process of an electronic or semiconductor device may entail securing a wafer or a non-conductor (e.g., glass) substrate at a certain position in a vacuum system in order to heat, etch, coat, or clean the wafer or substrate. The conventional securing techniques are mostly mechanical, e.g., using a clamp ring to hold the top edge of a workpiece or wafer in a mechanical manner. Such mechanical clamp rings, however, have several drawbacks when used in the semiconductor industry, which has an exceptionally high standard of quality. For instance, the edge of a workpiece or wafer secured in place by a mechanical clamp ring may end up with an irregular surface, with tiny particles on the surface, or with a shadow effect due to contact with the clamp ring. Recently, therefore, electrostatic securing devices (e.g., electrostatic chucks, or e-chucks) have gradually replaced the mechanical ones. Generally speaking, an electrostatic securing device involves two objects that have opposite charges or different electric potentials, and it is the electrostatic attraction between these two objects that secures one of the objects at a desired position with respect to the other. Unlike a mechanical clamp ring, an e-chuck will not cause a workpiece or wafer to produce tiny particles or the shadow effect around the edge, but if static electricity is not distributed evenly over the chuck surface, the attracted object will be subjected to uneven force application.

Furthermore, a semiconductor manufacturing process often uses highly reactive, halogen-based plasma for etching, coating, or cleaning, and the plasma may corrode the heating device used in the same manufacturing process if the heating device is not resistant to corrosion. Should the heating device be corroded, it may have an irregular surface or generate dust, thus failing to maintain temperature uniformity over the workpiece or wafer being heated, and this may in turn lower the quality of the film subsequently formed on the workpiece or wafer.

In short, the conventional securing or heating device used in a semiconductor manufacturing process tends to have uniformity issues that may impair the quality, and hence limit subsequent use, of the resulting workpiece or wafer. Further research efforts have been called for to enhance the quality of such workpieces and wafers from the perspective of their manufacturing processes.

BRIEF SUMMARY OF THE INVENTION

In view of this, in order to solve the above problems, the primary objective of the present invention is to provide a ceramic-circuit composite structure, comprising: a ceramic plate; a curved-surface circuit buried in the ceramic plate; and a power supply module electrically connected to the curved-surface circuit.

In a preferred embodiment, the ceramic plate has a supporting surface that has a recessed supporting portion.

In a preferred embodiment, the curved-surface circuit is a concave-surface heating circuit, a convex-surface heating circuit, or an irregularly curved-surface heating circuit.

In a preferred embodiment, the curved-surface circuit is a concave-surface static electricity circuit, a convex-surface static electricity circuit, or an irregularly curved-surface static electricity circuit.

In a preferred embodiment, the ceramic-circuit composite structure further includes a plasma control mesh or plasma control circuit buried in the ceramic plate and lying above the curved-surface circuit.

In a preferred embodiment, the ceramic-circuit composite structure further includes a static electricity circuit buried in the ceramic plate and lying above the curved-surface circuit.

In a preferred embodiment, the ceramic-circuit composite structure further includes a plasma control mesh or plasma control circuit buried in the ceramic plate and lying above the static electricity circuit.

In a preferred embodiment, the ceramic-circuit composite structure further includes a hollow ceramic tube provided between the ceramic plate and the power supply module, and a pair of metal electrodes are provided in the hollow ceramic tube and are electrically connected to the curved-surface circuit and the power supply module.

In a preferred embodiment, the ceramic-circuit composite structure further includes a hollow ceramic tube provided between the ceramic plate and the power supply module, and a pair of metal electrodes are provided in the hollow ceramic tube and are electrically connected to the curved-surface circuit, the static electricity circuit, the plasma control mesh or plasma control circuit, and the power supply module.

In a preferred embodiment, the material of the ceramic plate is selected from a group composed of a composition of aluminum nitride/yttrium oxide/carbon, a composition of aluminum oxide/magnesium oxide, silicon nitride, silicon carbide, resin, a semiconductor material, and an insulating material.

In a preferred embodiment, the curved-surface circuit is made of a metal material or a conductive material.

In a preferred embodiment, the metal material is a combination of molybdenum, tungsten, nickel, titanium, and carbon.

Another objective of the present invention is to provide a method for making the foregoing ceramic-circuit composite structure as follows: in step (a), a green body composed of ceramic particles is provided, and the green body is molded by a high-pressure curved-surface mold or is processed into a curved-surface green body after being formed by high-pressure molding; in step (b), at least one curved-surface circuit is prepared on one side of the green body by printing, by spray coating, or by making use of a ready-made circuit; in step (c), the green body is subjected to high-pressure molding to produce an unsintered ceramic plate; and in step (d), the unsintered ceramic plate is subjected to debinding, sintering, and grinding to produce the ceramic-circuit composite structure, wherein the sintering is atmospheric-pressure sintering, high-pressure sintering, or hydraulic-pressure sintering.

In a preferred embodiment, the step (b) further includes providing a plasma control mesh or plasma control circuit above the at least one curved-surface circuit.

In a preferred embodiment, the method for making the ceramic-circuit composite structure further includes step (e), in which a hollow ceramic tube is adhesively bonded to the ceramic-circuit composite structure and then a pair of metal electrodes are disposed in the hollow ceramic tube and joined to the ceramic-circuit composite structure by co-firing.

Another objective of the present invention is to provide a method for making the foregoing ceramic-circuit composite structure, wherein the method includes the steps of: (a) providing a green body that is composed of ceramic particles and shaped by tape casting; (b) preparing at least one curved-surface circuit on one side of the green body by printing, by spray coating, or by making use of a ready-made circuit; (c) subjecting the green body to lamination (through tape casting), followed by cold isostatic pressing or hydraulic pressing to produce an unsintered ceramic plate; and (d) debinding, sintering, and then grinding the unsintered ceramic plate to produce the ceramic-circuit composite structure, wherein the sintering may be atmospheric-pressure sintering, high-pressure sintering, or hydraulic-pressure sintering.

In a preferred embodiment, the step (b) of the method for making the ceramic-circuit composite structure further includes providing a plasma control mesh or plasma control circuit above the at least one curved-surface circuit.

A conventional e-chuck or heating device for use in a manufacturing process generally includes a planar circuit, which has less static electricity or lower temperature at the center than in the peripheral region. By contrast, the present invention provides a ceramic-circuit composite structure with a curved-surface circuit adaptable to the line width(s) of a control circuit to achieve uniform distribution of static electricity or temperature, thereby solving the prior art problem that a workpiece or wafer held by a conventional e-chuck or heated by a conventional heating device may be subjected to uneven force application or uneven heating. Moreover, the ceramic-circuit composite structure of the present invention may include a plasma control mesh or plasma control circuit in addition to a heating circuit and/or a static electricity circuit, the objective being to increase the plasma attraction of the plasma generator used in a manufacturing process. Thus, the invention contributes to enhancing workpiece or wafer quality.

DETAILED DESCRIPTION OF THE INVENTION

Figure 1:
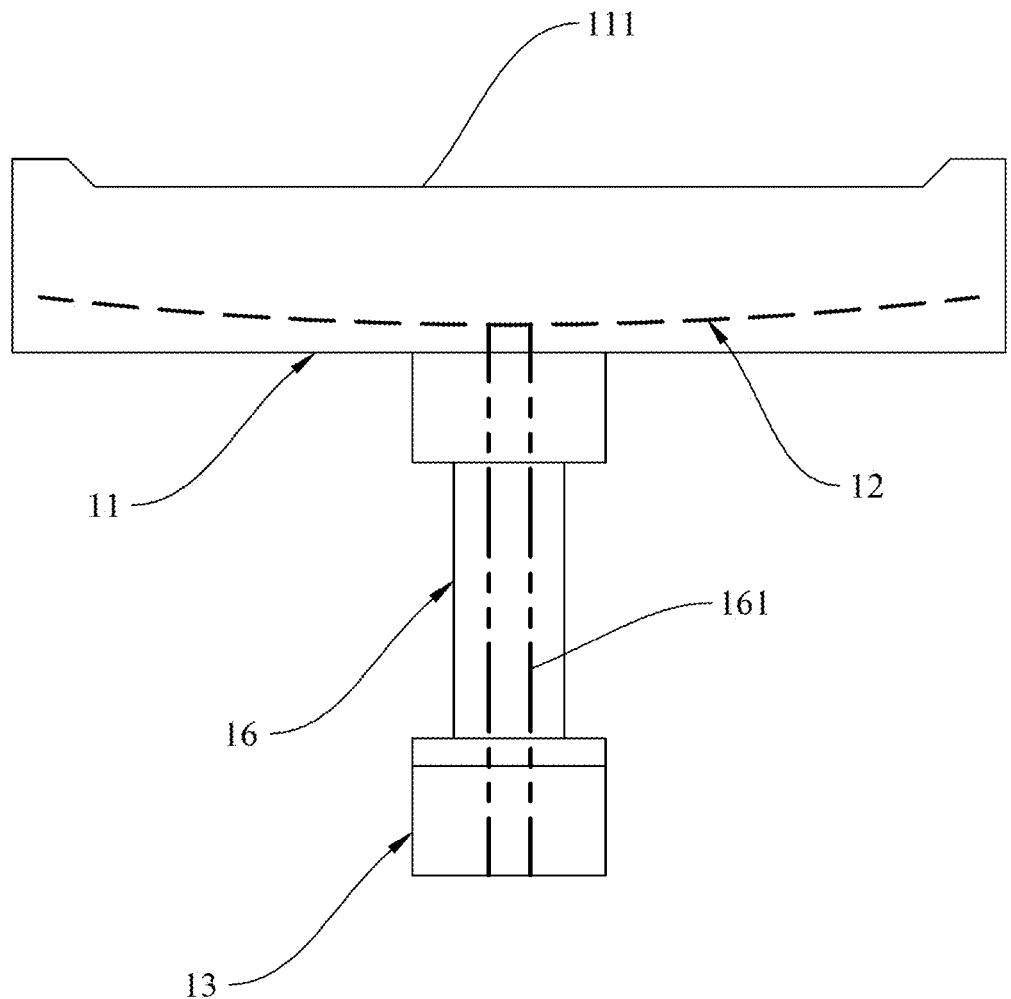
FIG. 1 is a sectional view according to the first embodiment of the present invention.

The details and technical solution of the present invention are hereunder described with reference to accompanying drawings. For illustrative sake, the accompanying drawings are not drawn to scale. The accompanying drawings and the scale thereof are not restrictive of the present invention.

The use of "comprise" means not excluding the presence or addition of one or more other components, steps, operations, or elements to the described components, steps, operations, or elements, respectively. Similarly, "comprise," "comprises," "comprising" "include," "includes," and "including" are interchangeable and not intended to be limiting. As used herein and in the appended claims, the singular forms "a," "an," and "the" include plural referents unless the context dictates otherwise. The terms "a", "an," "the," "one or more," and "at least one," for example, can be used interchangeably herein.

The present invention provides a ceramic-circuit composite structure that includes a ceramic plate, a curved-surface circuit, and a power supply module. The curved-surface circuit is buried in the ceramic plate, and the power supply module is electrically connected to the curved-surface circuit.

The ceramic-circuit composite structure disclosed herein is suitable for use in various fields, particularly in the fields of electronics and semiconductor technology, where high-precision manufacturing processes are generally required. A person skilled in the art may make equivalent changes and modifications to the ceramic-circuit composite structure as appropriate to the intended industry or manufacturing process, and there is no limitation on the industry to which the ceramic-circuit composite structure can be applied. In a preferred embodiment, the ceramic-circuit composite structure can serve as a heating device, a holding device (e.g., an e-chuck or electrostatic transfer arm), or a supporting device, and the material of the ceramic plate/ceramic arm (also known as an electrostatic transfer arm or e-chuck) can be adjusted to meet application needs.

The "ceramic plate" disclosed herein is configured to support a substance or object and has a supporting surface that either is flat or has a recessed supporting portion. A flat ceramic plate may be used as, for example, a ceramic arm or ceramic e-chuck, whereas a ceramic plate with a recessed supporting portion may serve as, for example, a ceramic heating device. The ceramic plate may have a patterned or plated/coated surface or be provided with an ejector, and the shape of the ceramic plate can be adjusted as needed. In a preferred embodiment, the ceramic plate is made of a composition of aluminum nitride/yttrium oxide/carbon, a composition of aluminum oxide/magnesium oxide, a composition of silicon nitride/magnesium oxide (or aluminum oxide), silicon nitride, silicon carbide, resin, a semiconductor material, an insulating material, or a composite material of the above.

If necessary, the ceramic-circuit composite structure may further include a hollow ceramic tube provided between the ceramic plate and the power supply module. The hollow ceramic tube may function as a supporting member for the ceramic plate and have metal electrodes inserted in its hollow interior space. The hollow ceramic tube and the ceramic plate (and/or the power supply module) may be adhesively bonded together by, for example but not limited to, an adhesive for ceramic, an adhesive for metal, or a resin-based adhesive that is resistant to high heat. The metal electrodes may be joined to the circuit (which may include at least one planar circuit in addition to the curved-surface circuit) by a metal co-firing process, such as by applying silver paste, copper paste, or any other metallic conductive adhesive to the joint and then sintering the joint at a high temperature. In a preferred embodiment, a pair of metal electrodes are provided in the hollow ceramic tube and are electrically connected to the curved-surface circuit and the power supply module. In a preferred embodiment, a pair of metal electrodes are provided in the hollow ceramic tube and are electrically connected to the curved-surface circuit, a static electricity circuit, a plasma control mesh or plasma control circuit, and the power supply module. In a preferred embodiment, the hollow ceramic tube is integrally formed. The material of the hollow ceramic tube may be the same as or different from that of the ceramic plate. In a preferred embodiment, the hollow ceramic tube is made of a composition of aluminum nitride/yttrium oxide/carbon, a composition of aluminum oxide/magnesium oxide, a composition of silicon nitride/magnesium oxide (or aluminum oxide), silicon nitride, silicon carbide, resin, a semiconductor material, an insulating material, or a composite material of the above.

All the "circuits" disclosed herein may be made by printing (e.g., screen printing or stencil printing) or spray coating or be ready-made circuits; the present invention has no limitation in this regard. The heating circuit, static electricity circuit, or plasma control circuit in the invention may, be it a curved-surface circuit or planar circuit, have a uniform line width or different line widths. The circuits disclosed herein (including planar circuits and curved-surface circuits) are made of metal or a conductive material, such as but not limited to gold, silver, rubidium, palladium, platinum, molybdenum, aluminum, tungsten, nickel, titanium, carbon, or a combination of the above. For example, the circuits in a preferred embodiment of the invention are made of a combination of tungsten/molybdenum/carbon.

As used herein, the term "curved-surface circuit" refers to a circuit or electrical network so distributed as to form a curved surface, which may be a concave surface, a convex surface, an irregularly curved surface, or a combination of the above. The type of the curved surface can be selected as appropriate, and the curvature(s) of the curved surface can be adjusted to produce the desired effect; the present invention has no limitation on the configuration or curvature(s) of the curved surface. The curved-surface circuit in a preferred embodiment is made of a combination of molybdenum, tungsten, nickel, titanium, and carbon. In one preferred embodiment, the curved-surface circuit is a concave-surface heating circuit, a convex-surface heating circuit, or an irregularly curved-surface heating circuit. In another preferred embodiment, the curved-surface circuit is a concave-surface static electricity circuit, a convex-surface static electricity circuit, or an irregularly curved-surface static electricity circuit.

If necessary, the ceramic-circuit composite structure may further include a plasma control mesh or plasma control circuit. In a preferred embodiment, the plasma control mesh or circuit is buried in the ceramic plate and lies above the curved-surface circuit. In a preferred embodiment, the plasma control mesh or circuit is a planar circuit or a curved-surface circuit. In a more preferred embodiment, the plasma control mesh or circuit is a curved-surface circuit, wherein the curved surface may be a concave surface, a convex surface, an irregularly curved surface, or a combination of the above; wherein the curved-surface circuit may have a uniform line width or different line widths; and wherein the type of the curved surface can be selected as needed, and the curvature(s) of the curved surface and/or the line width(s) can be adjusted to produce the desired effect. The present invention has no limitation on the curved surface combination, curvature(s), or line width(s) of the plasma control mesh or circuit.

The ceramic plate disclosed herein may include one or more circuits. In a preferred embodiment, the ceramic-circuit composite structure includes a curved-surface circuit and a planar circuit, both buried in the ceramic plate, wherein the curved-surface circuit is a heating circuit and the planar circuit is a static electricity circuit, wherein the static electricity circuit lies above the curved-surface circuit, and wherein each of the circuits may have a uniform line width or different line widths. In a preferred embodiment, the ceramic-circuit composite structure includes a curved-surface circuit and a planar circuit, both buried in the ceramic plate, wherein the curved-surface circuit is a static electricity circuit and the planar circuit is a heating circuit. In a preferred embodiment, the ceramic-circuit composite structure includes one or more curved-surface circuits, wherein the at least one curved-surface circuit may be, for example but not limited to, a heating circuit, a static electricity circuit, a plasma control circuit, or a combination of the above. In a preferred embodiment, the ceramic-circuit composite structure includes a curved-surface circuit, a static electricity circuit, and a plasma control mesh or circuit, all buried in the ceramic plate, wherein the curved-surface circuit may be a concave-surface heating circuit, a convex-surface heating circuit, or an irregularly curved-surface heating circuit; wherein the static electricity circuit lies above the curved-surface circuit; and wherein the plasma control mesh or circuit lies above the static electricity circuit and may have a uniform line width or different line widths.

The present invention also provides a method for making the foregoing ceramic-circuit composite structure as follows. In step (a), a green body composed of ceramic particles is provided. The green body is molded by a high-pressure curved-surface mold or is processed into a curved-surface green body after being formed by high-pressure molding. In step (b), at least one curved-surface circuit is prepared on one side of the green body by printing, by spray coating, or by making use of a ready-made circuit. In step (c), the green body is subjected to high-pressure molding to produce an unsintered ceramic plate. In step (d), the unsintered ceramic plate is subjected to debinding, sintering, and grinding to produce the ceramic-circuit composite structure, wherein the sintering may be atmospheric-pressure sintering, high-pressure sintering, or hydraulic-pressure sintering. In a preferred embodiment, step (b) further includes providing a plasma control mesh or plasma control circuit above the at least one curved-surface circuit, wherein the plasma control mesh or circuit may have a uniform line width or different line widths. In a preferred embodiment, the method further includes step (e), in which a hollow ceramic tube is adhesively bonded to the ceramic-circuit composite structure and then a pair of metal electrodes are disposed in the hollow ceramic tube and joined to the ceramic-circuit composite structure by co-firing.

The present invention further provides another method for making the foregoing ceramic-circuit composite structure, wherein the method includes the steps of: (a) providing a green body that is composed of ceramic particles and shaped by tape casting; (b) preparing at least one curved-surface circuit on one side of the green body by printing, by spray coating, or by making use of a ready-made circuit, wherein the curved-surface circuit may have a uniform line width or different line widths; (c) subjecting the green body to lamination (through tape casting), followed by cold isostatic pressing or hydraulic pressing to produce an unsintered ceramic plate; and (d) debinding, sintering, and then grinding the unsintered ceramic plate to produce the ceramic-circuit composite structure, wherein the sintering may be atmospheric-pressure sintering, high-pressure sintering, or hydraulic-pressure sintering. In a preferred embodiment, step (b) further includes providing a plasma control mesh or plasma control circuit above the at least one curved-surface circuit, wherein the plasma control mesh or circuit may have a uniform line width or different line widths.

A detailed description of some illustrative embodiments of the present invention is given below to facilitate a better understanding of the invention. Those embodiments, however, serve explicative purpose only and are not intended to be restrictive of the scope of the invention.

First Embodiment

Figure 2:
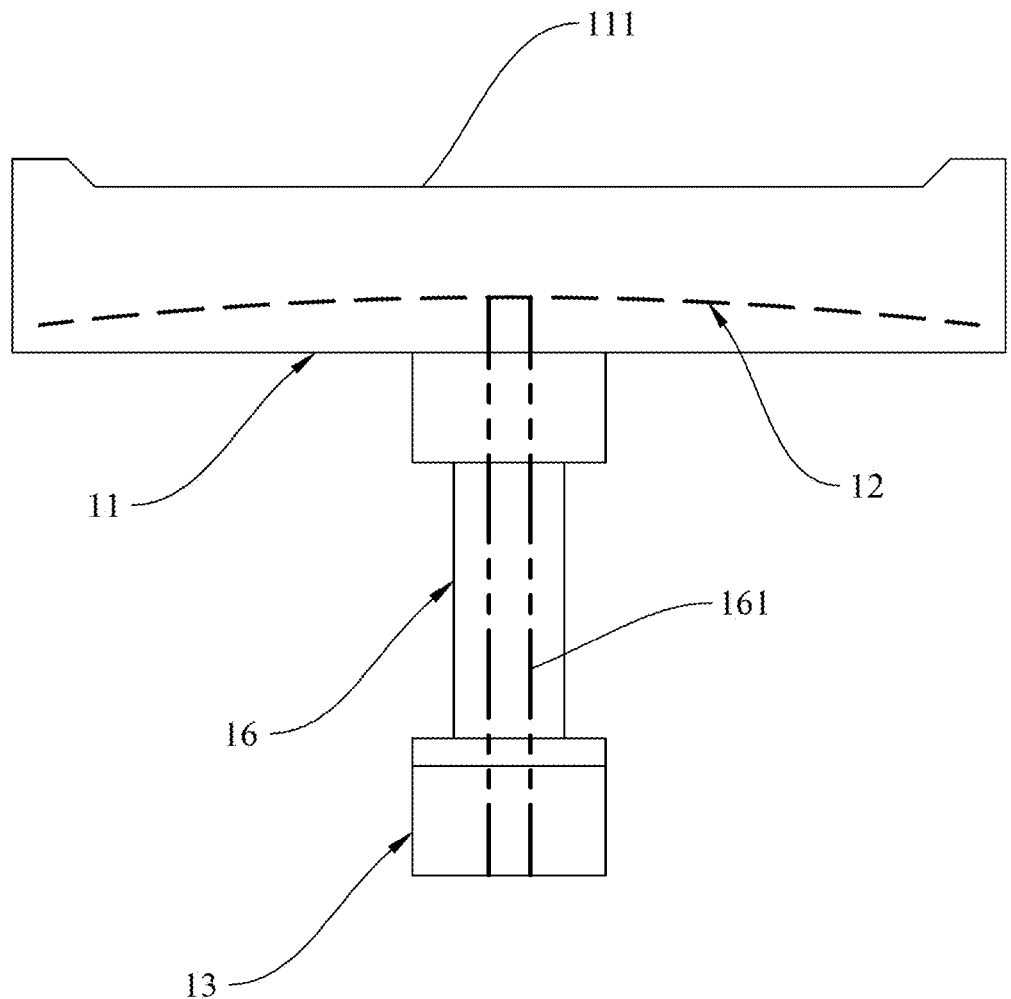
FIG. 2 is a sectional view according to the first embodiment of the present invention.
Figure 3:
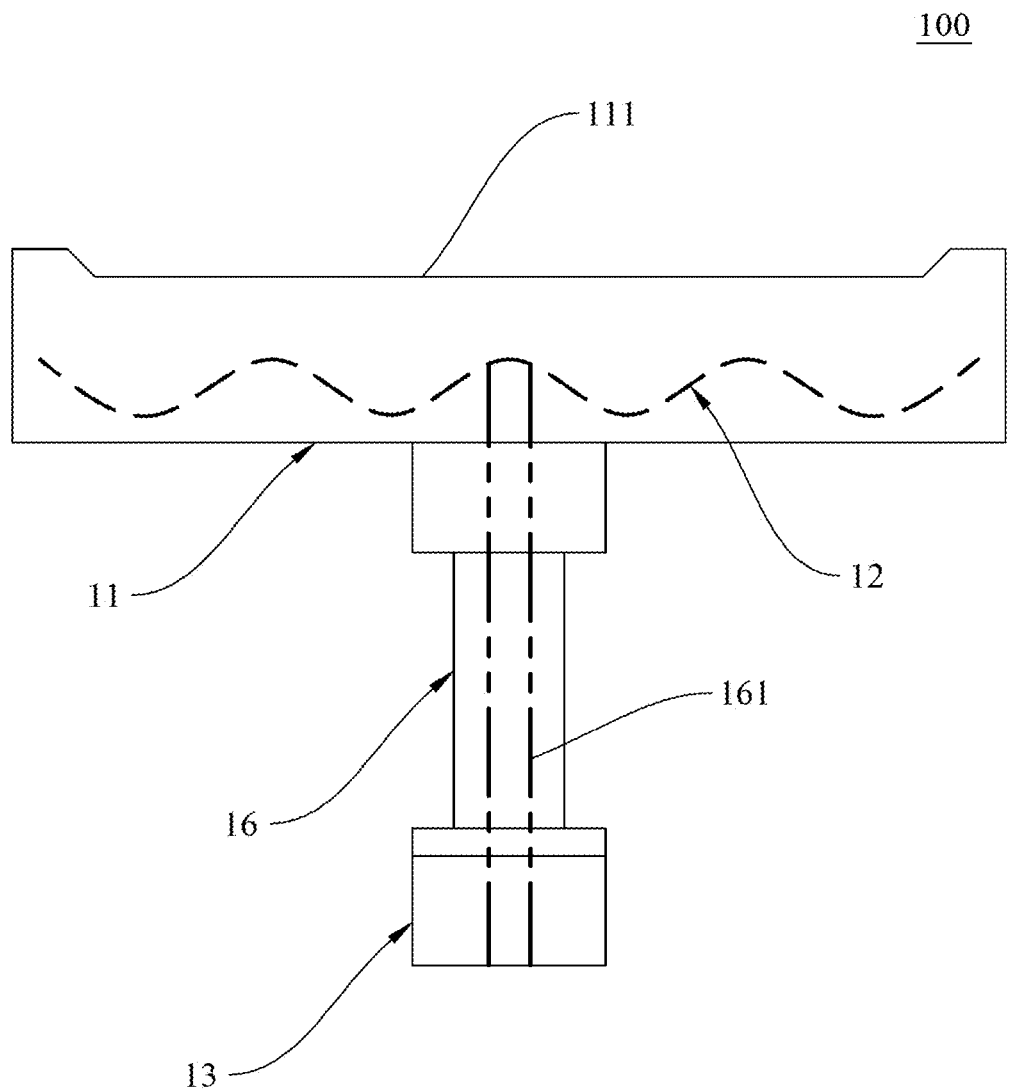
FIG. 3 is a sectional view according to the first embodiment of the present invention.

FIG. 1 to FIG. 3 are sectional views showing three different configurations of the ceramic-circuit composite structure 100 according to the first embodiment of the present invention. The configurations in FIG. 1 to FIG. 3 include a concave-surface circuit, a convex-surface circuit, and an irregularly curved-surface circuit respectively.

The ceramic-circuit composite structure 100 according to the first embodiment includes a ceramic plate 11, a hollow ceramic tube 16, a curved-surface circuit 12 (which may have a uniform line width or different line widths), and a power supply module 13. The curved-surface circuit 12 is buried in the ceramic plate 11. The hollow ceramic tube 16 is located, and adhesively bonded, between the ceramic plate 11 and the power supply module 13. A pair of metal electrodes 161 are provided in the hollow ceramic tube 16 and are electrically connected to the curved-surface circuit 12 and the power supply module 13.

The ceramic plate 11 has a recessed supporting portion 111 for supporting a wafer in such a way that the wafer is kept from sliding off the recessed supporting portion 111. The edges of each of the ceramic plate 11, the hollow ceramic tube 16, and the power supply module 13 may be chamfered to prevent breaking under an externally applied force.

The curved-surface circuit 12 may be a heating circuit or a static electricity circuit (each of which may have a uniform line width or different line widths), in order for the ceramic-circuit composite structure 100 to serve as a heating device or e-chuck. More specifically, the curved-surface circuit 12 may be a concave-surface heating circuit or a concave-surface static electricity circuit (as shown in FIG. 1), a convex-surface heating circuit or a convex-surface static electricity circuit (as shown in FIG. 2), or an irregularly curved-surface heating circuit or an irregularly curved-surface static electricity circuit (as shown in FIG. 3). The curved-surface circuit 12 may be made by screen printing, stencil printing, or spray coating, or simply be a ready-made circuit; in either case, the curved-surface circuit 12 should end up buried in the ceramic plate 11.

In contrast to the prior art, in which a conventional planar circuit tends to have lower temperature or less static electricity at the center than in the peripheral region, the first embodiment of the present invention advantageously solves the problem of uneven heating or uneven static electricity distribution by using the curved-surface circuit and allowing the line width(s) of the circuit to be adjusted as needed.

Second Embodiment

Figure 4:
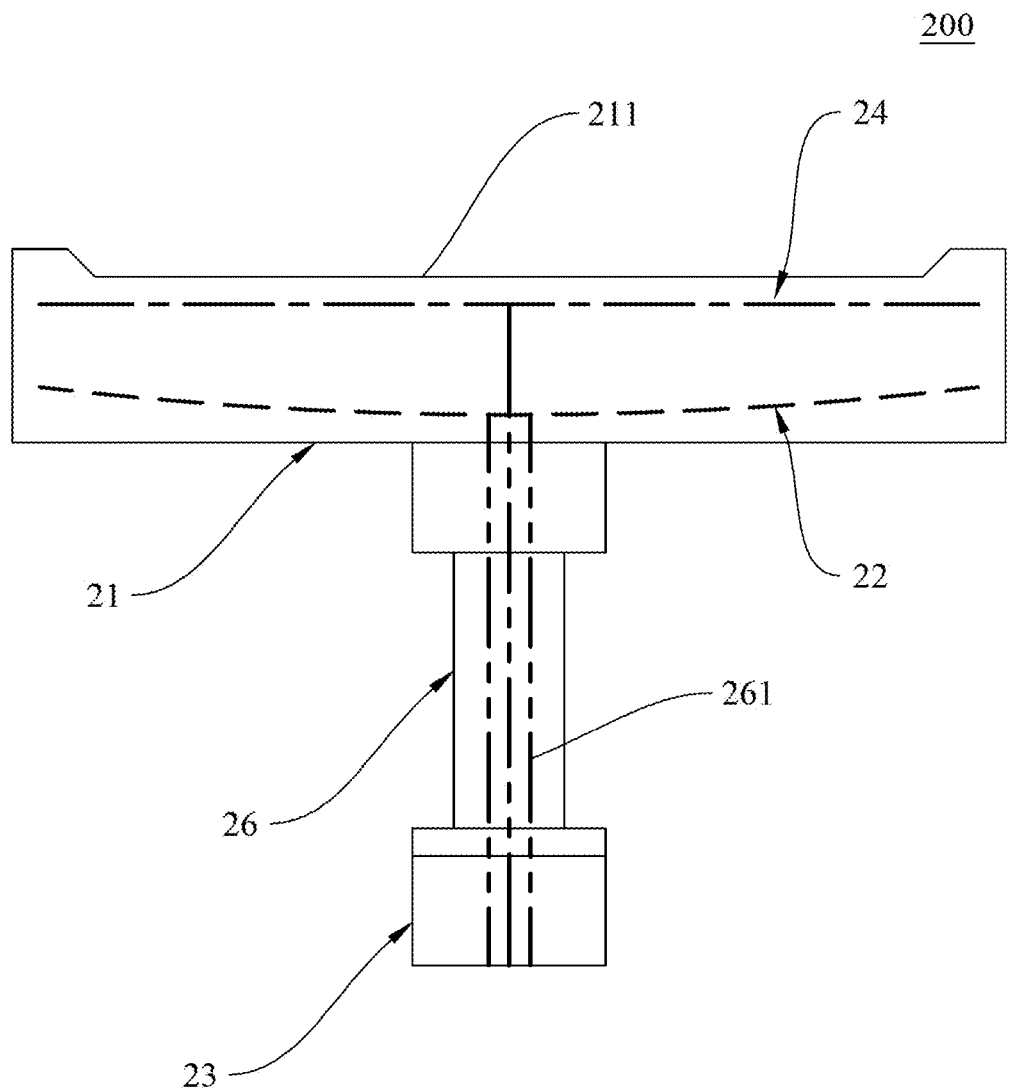
FIG. 4 is a sectional view according to the second embodiment of the present invention.
Figure 5:
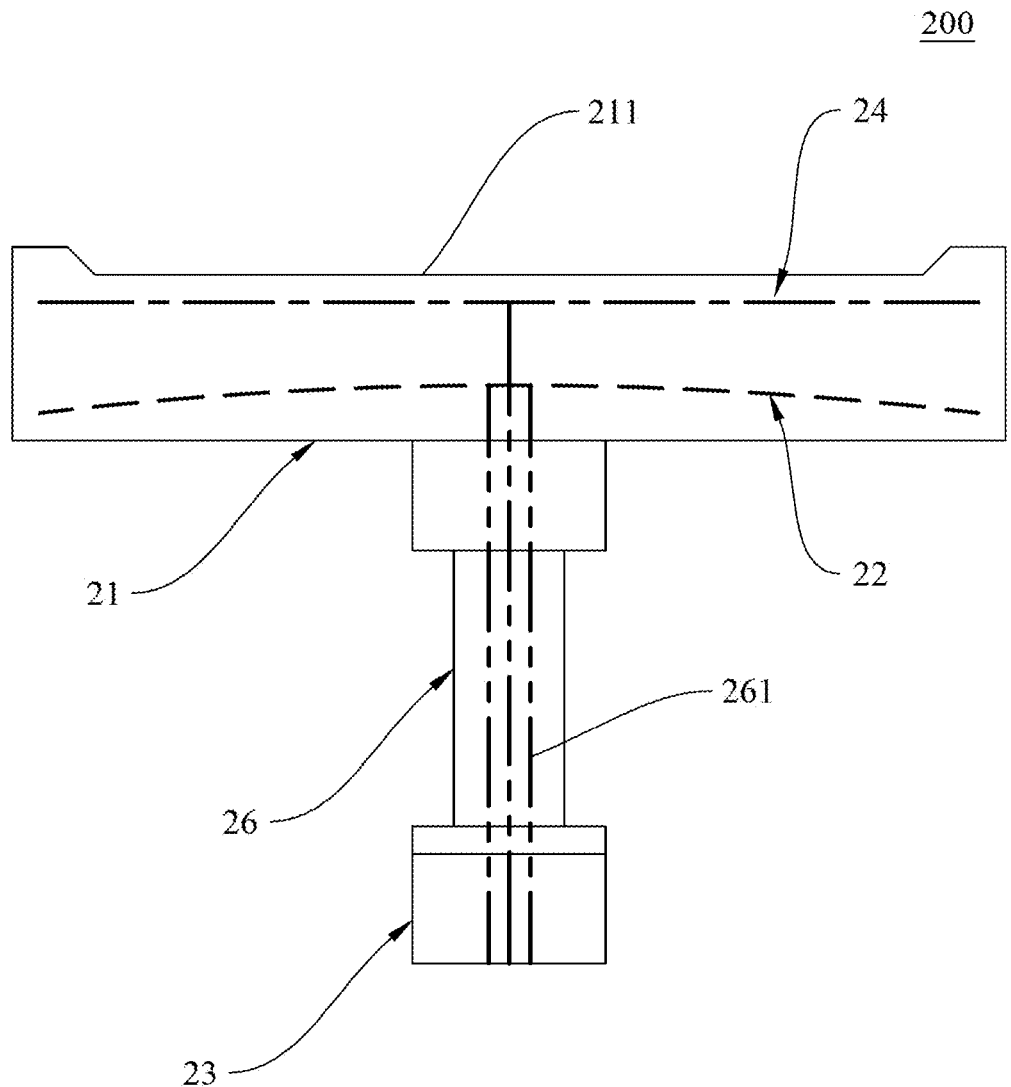
FIG. 5 is a sectional view according to the second embodiment of the present invention.
Figure 6:
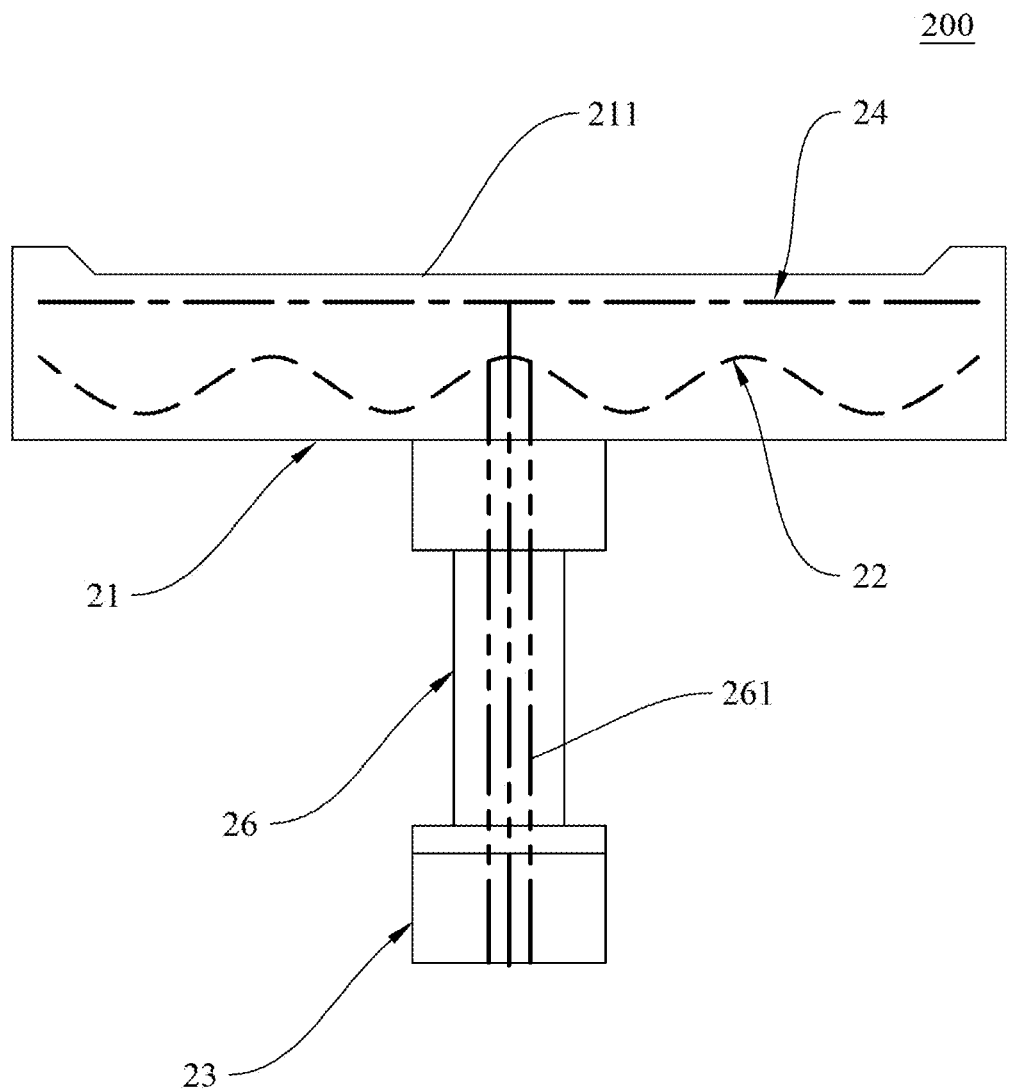
FIG. 6 is a sectional view according to the second embodiment of the present invention.

FIG. 4 to FIG. 6 are sectional views showing three different configurations of the ceramic-circuit composite structure 200 according to the second embodiment of the present invention, wherein each configuration includes a plasma control mesh or plasma control circuit 24 in addition to a concave-surface circuit (which may have a uniform line width or different line widths), a convex-surface circuit (which may have a uniform line width or different line widths), or an irregularly curved-surface circuit (which may have a uniform line width or different line widths).

The second embodiment is based on the first embodiment but is different from the first embodiment in that the ceramic-circuit composite structure 200 includes not only a ceramic plate 21 (which is shown in the drawings as having a recessed supporting portion 211), a hollow ceramic tube 26 (which is provided therein with a pair of metal electrodes 261), a curved-surface circuit 22, and a power supply module 23, but also a plasma control mesh or plasma control circuit 24. Both the curved-surface circuit 22 (which may have a uniform line width or different line widths) and the plasma control mesh or circuit 24 (which may also have a uniform line width or different line widths) are buried in the ceramic plate 21, and the plasma control mesh or circuit 24 lies above the curved-surface circuit 22.

The curved-surface circuit 22 may be a heating circuit or a static electricity circuit in order for the ceramic-circuit composite structure 200 to serve either as a ceramic heater with a plasma control mesh (or circuit) or as an e-chuck with a plasma control mesh (or circuit). More specifically, the curved-surface circuit 22 may be a concave-surface heating circuit or a concave-surface static electricity circuit (as shown in FIG. 4), a convex-surface heating circuit or a convex-surface static electricity circuit (as shown in FIG. 5), or an irregularly curved-surface heating circuit or an irregularly curved-surface static electricity circuit (as shown in FIG. 6). Each of the aforesaid curved-surface circuits may have a uniform line width or different line widths. The curved-surface circuit 22 and the plasma control mesh or circuit 24 may be made by screen printing, stencil printing, or spray coating, or simply be ready-made circuits. Moreover, the curved-surface circuit 22 and the plasma control mesh or circuit 24 may be made by the same method or by different methods respectively.

In this embodiment, the plasma control mesh or circuit 24 is a planar circuit. In another embodiment, however, the plasma control mesh or circuit 24 may be a curved-surface circuit instead, wherein the curved surface may be, for example but not limited to, a concave surface, a convex surface, or an irregularly curved surface. A curved-surface plasma control mesh or circuit 24 (which may have a uniform line width or different line widths) allows plasma uniformity to be adjusted.

As is well known in the art, a common plasma generator generates positive charges. The plasma control mesh or circuit in the present invention is configured to generate negative charges so that the attractive forces of the positive charges of a plasma generator can be effectively increased by the attraction between positive and negative charges.

Third Embodiment

Figure 7:
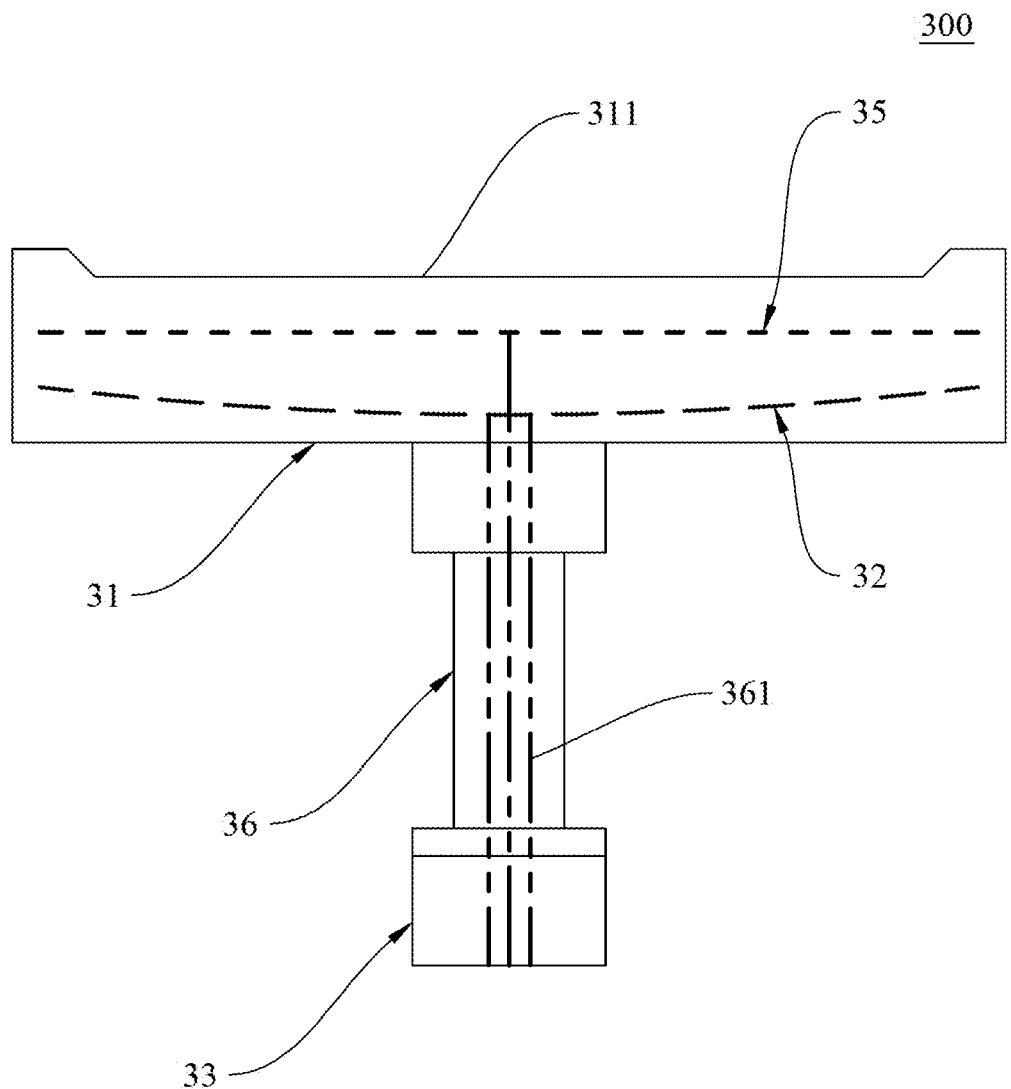
FIG. 7 is a sectional view according to the third embodiment of the present invention.
Figure 8:
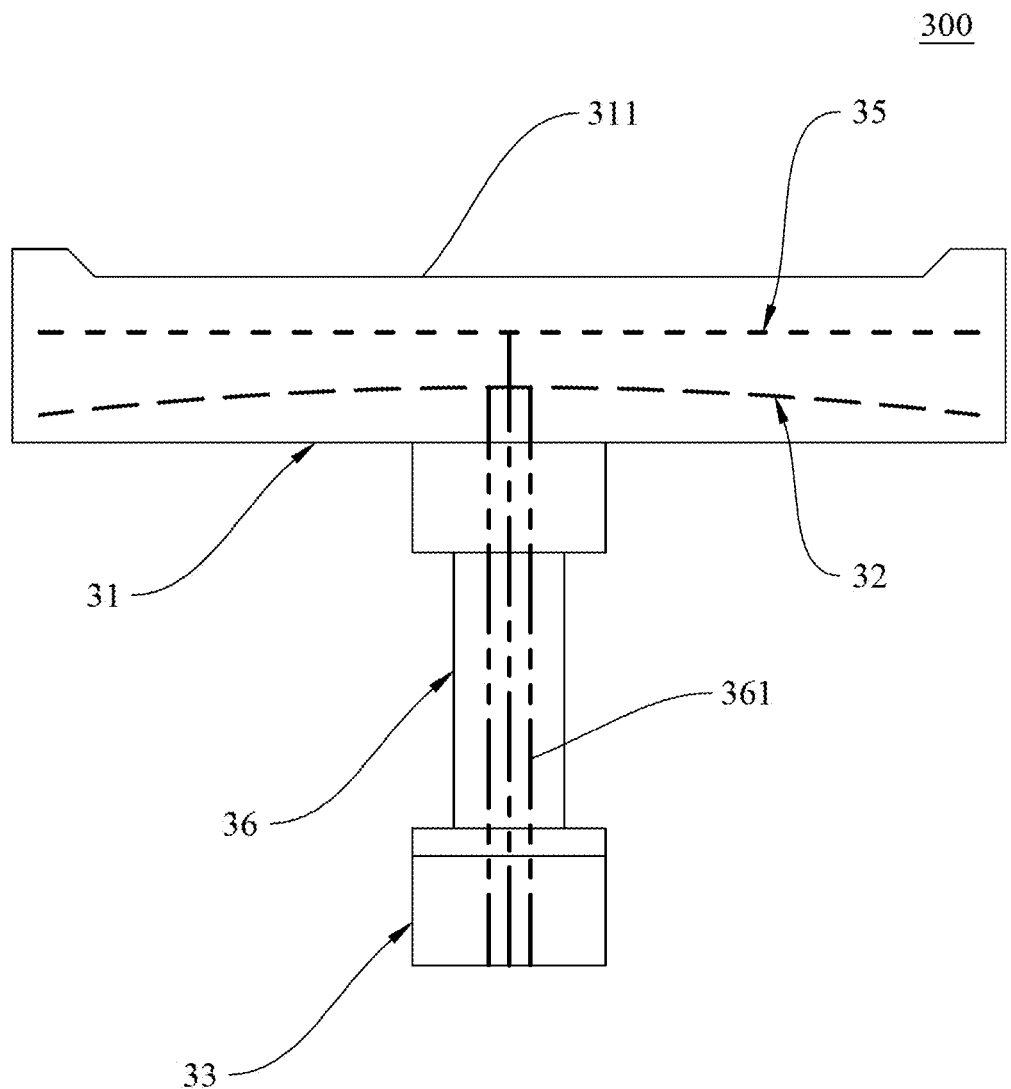
FIG. 8 is a sectional view according to the third embodiment of the present invention.
Figure 9:
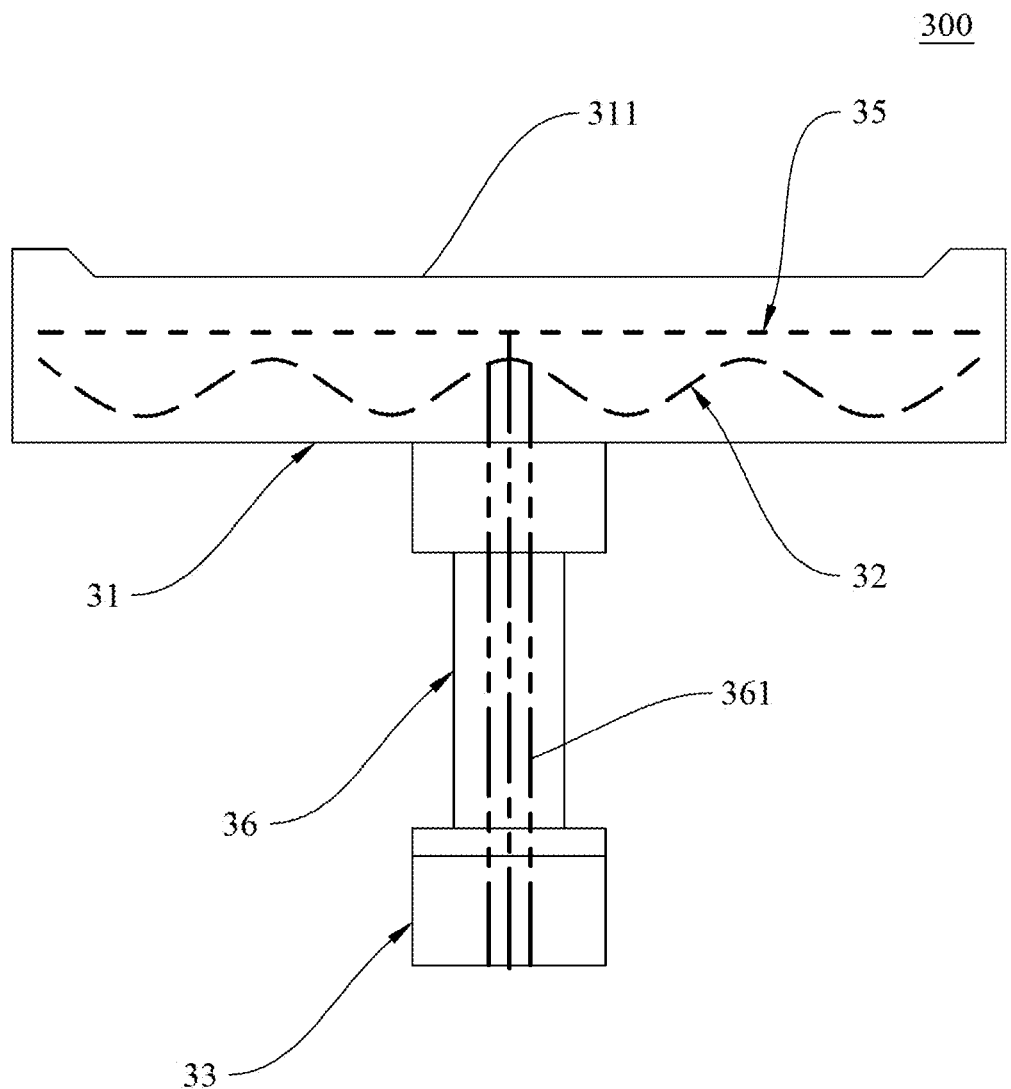
FIG. 9 is a sectional view according to the third embodiment of the present invention.

FIG. 7 to FIG. 9 are sectional views showing three different configurations of the ceramic-circuit composite structure 300 according to the third embodiment of the present invention, wherein each configuration includes a static electricity circuit 35 in addition to a concave-surface heating circuit, a convex-surface heating circuit, or an irregularly curved-surface heating circuit.

The third embodiment is based on the first embodiment but is different from the first embodiment in that the ceramic-circuit composite structure 300 includes not only a ceramic plate 31 (which is shown in the drawings as having a recessed supporting portion 311), a hollow ceramic tube 36 (which is provided therein with a pair of metal electrodes 361), a curved-surface circuit 32, and a power supply module 33, but also a static electricity circuit 35. Both the curved-surface circuit 32 and the static electricity circuit 35 are buried in the ceramic plate 31, and the static electricity circuit 35 lies above the curved-surface circuit 32.

The curved-surface circuit 32 may be a heating circuit with a uniform line width or different line widths, thereby rendering the ceramic-circuit composite structure 300 into a ceramic heater with an e-chuck. More specifically, the curved-surface circuit 32 may be a concave-surface heating circuit (as shown in FIG. 7), a convex-surface heating circuit (as shown in FIG. 8), or an irregularly curved-surface heating circuit (as shown in FIG. 9). The curved-surface circuit 32 and the static electricity circuit 35 may be made by screen printing, stencil printing, or spray coating, or simply be ready-made circuits. Moreover, the curved-surface circuit 32 and the static electricity circuit 35 may be made by the same method or by different methods respectively.

In this embodiment, the static electricity circuit 35 is a planar circuit. In another embodiment, however, the static electricity circuit 35 may be a curved-surface circuit instead, wherein the curved surface may be, for example but not limited to, a concave surface, a convex surface, or an irregularly curved surface. Moreover, the static electricity circuit 35 may have a uniform line width or different line widths. A curved-surface static electricity circuit 35 allows the distribution of static electricity to be adjusted.

This embodiment is advantageous in that, while the ceramic-circuit composite structure 300 is used to heat a workpiece or wafer, the workpiece or wafer is securely attached to the ceramic-circuit composite structure 300 via static electricity and therefore can be heated evenly by the heating device (i.e., the ceramic-circuit composite structure 300). The prior art problem of subjecting a workpiece or wafer to uneven heating or uneven force application is thus overcome.

Fourth Embodiment

Figure 10:
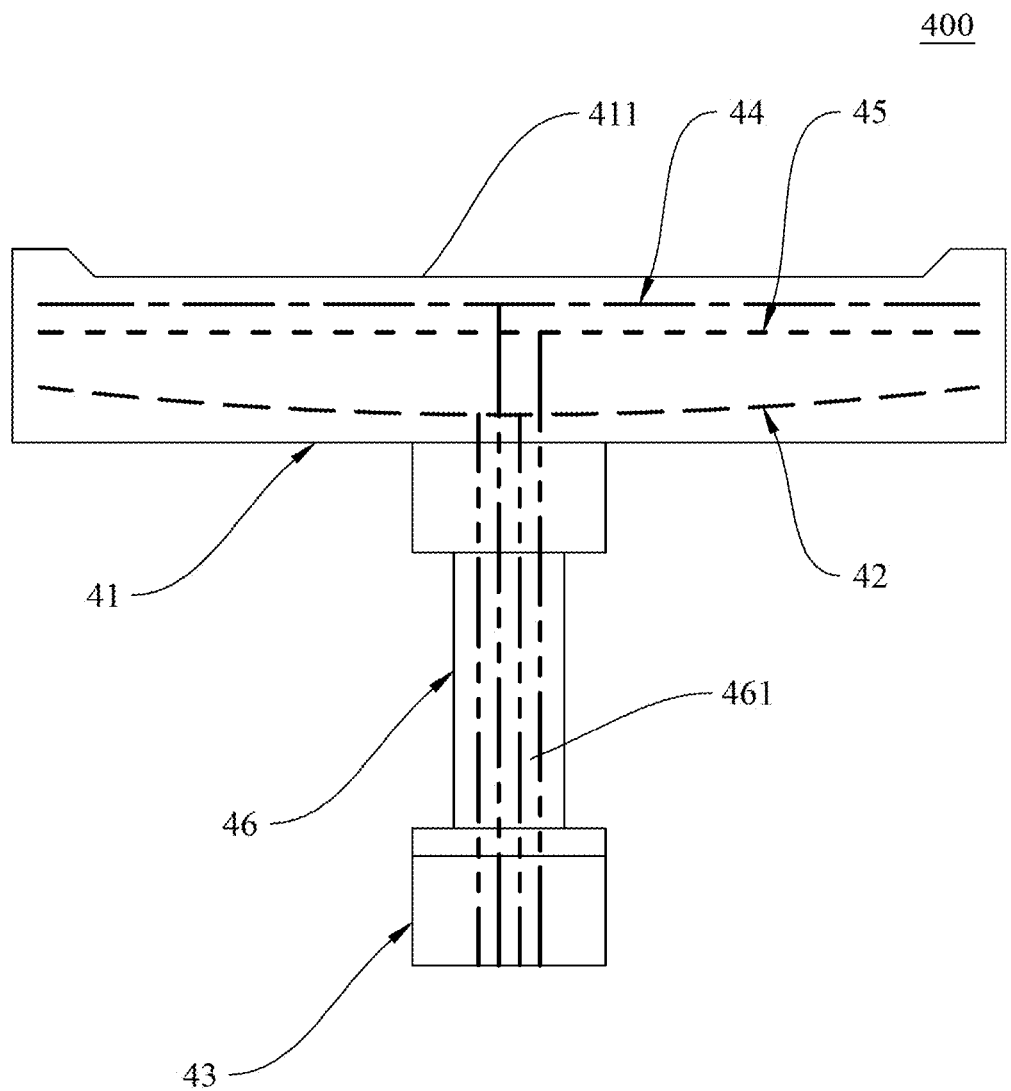
FIG. 10 is a sectional view according to the fourth embodiment of the present invention.
Figure 11:
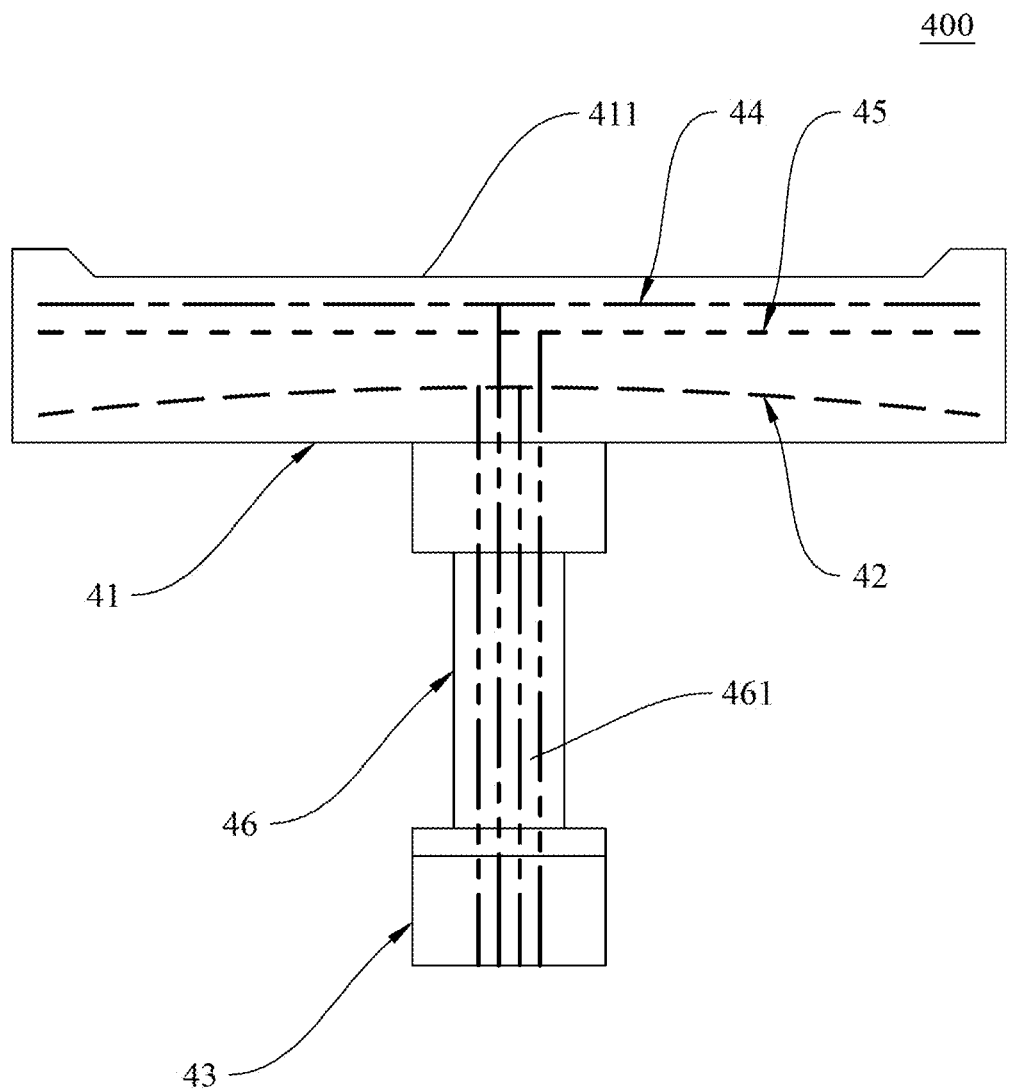
FIG. 11 is a sectional view according to the fourth embodiment of the present invention.
Figure 12:
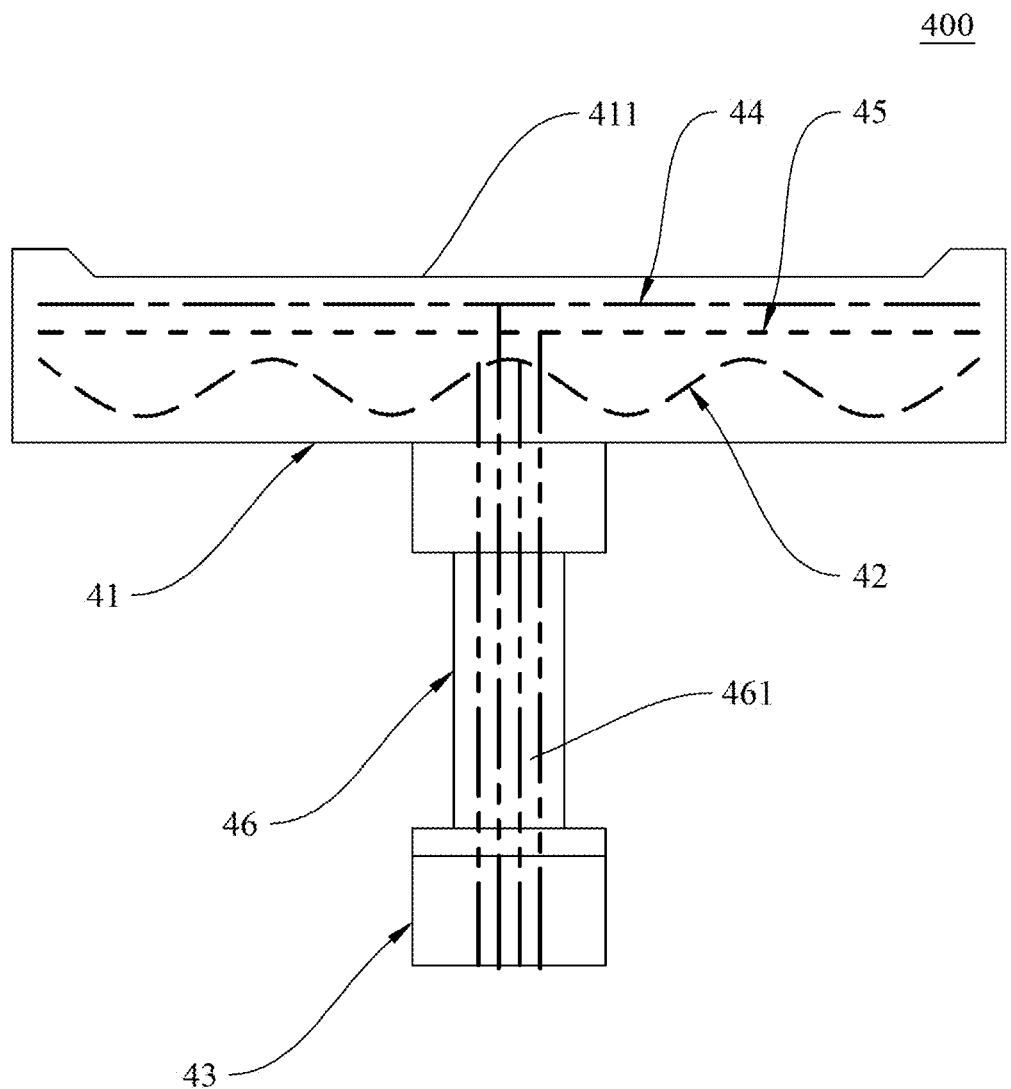
FIG. 12 is a sectional view according to the fourth embodiment of the present invention.

FIG. 10 to FIG. 12 are sectional views showing three different configurations of the ceramic-circuit composite structure 400 according to the fourth embodiment of the present invention, wherein each configuration includes a plasma control mesh or plasma control circuit 44 and a static electricity circuit 45 in addition to a concave-surface heating circuit, a convex-surface heating circuit, or an irregularly curved-surface heating circuit.

The fourth embodiment is based on the first embodiment but is different from the first embodiment in that the ceramic-circuit composite structure 400 includes not only a ceramic plate 41 (which is shown in the drawings as having a recessed supporting portion 411), a hollow ceramic tube 46 (which is provided therein with a pair of metal electrodes 461), a curved-surface circuit 42 (which may have a uniform line width or different line widths), and a power supply module 43, but also a static electricity circuit 45 and a plasma control mesh (or plasma control circuit) 44. The curved-surface circuit 42, the static electricity circuit 45, and the plasma control mesh (or circuit) 44 are all buried in the ceramic plate 41. The static electricity circuit 45 lies above the curved-surface circuit 42, and the plasma control mesh (or circuit) 44 lies above the static electricity circuit 45.

The curved-surface circuit 42 may be a heating circuit, thereby rendering the ceramic-circuit composite structure 400 into a ceramic heater with a plasma control mesh (or circuit) and an e-chuck. More specifically, the curved-surface circuit 42 may be a concave-surface heating circuit (as shown in FIG. 10), a convex-surface heating circuit (as shown in FIG. 11), or an irregularly curved-surface heating circuit (as shown in FIG. 12). The curved-surface circuit 42, the static electricity circuit 45, and the plasma control mesh (or circuit) 44 may be made by screen printing, stencil printing, or spray coating, or simply be ready-made circuits. Moreover, the three circuits may each have a uniform line width or different line widths and may be made by the same method or by different methods respectively.

In this embodiment, both the static electricity circuit 45 and the plasma control mesh (or circuit) 44 are planar circuits. In another embodiment, however, each of the static electricity circuit 45 and the plasma control mesh (or circuit) 44 may be a planar circuit or curved-surface circuit regardless of the configuration of the other, wherein the curved surface may be, for example but not limited to, a concave surface, a convex surface, or an irregularly curved surface. Moreover, the static electricity circuit 45 and the plasma control mesh (or circuit) 44 may each have a uniform line width or different line widths. A curved-surface static electricity circuit 45 allows the distribution of static electricity to be adjusted, while a curved-surface plasma control mesh (or circuit) 44 allows plasma uniformity to be adjusted.

This embodiment is advantageous in that a workpiece or wafer can be heated by the ceramic-circuit composite structure 400 while being attached thereto via static electricity, and that the ceramic-circuit composite structure 400 can increase the attractive forces of the positive charges generated by the plasma generator used in a manufacturing process. The present invention, therefore, helps improve product quality not only by enabling uniform temperature distribution over a heating device, but also by increasing the effectiveness of a plasma-based manufacturing process.

Fifth Embodiment

Figure 13:
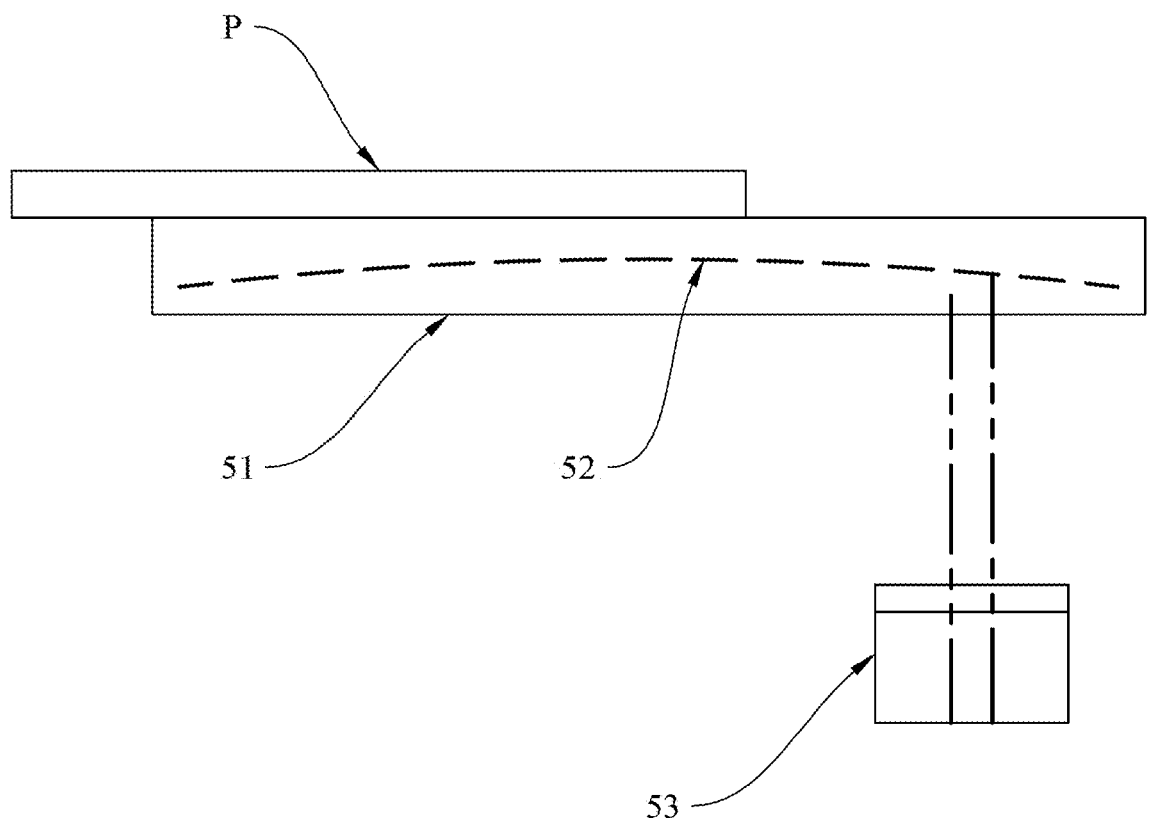
FIG. 13 is a sectional view according to the fifth embodiment of the present invention.

FIG. 13 is a sectional view of the ceramic-circuit composite structure 500 according to the fifth embodiment of the present invention.

The ceramic-circuit composite structure 500 according to the fifth embodiment includes a ceramic plate 51, a curved-surface circuit 52, and a power supply module 53. The curved-surface circuit 52 is buried in the ceramic plate 51, and the power supply module 53 is electrically connected to the curved-surface circuit 52.

The curved-surface circuit 52 may be a static electricity circuit. The ceramic plate 51 has a planar configuration and is designed to attract an object P electrostatically and serve as an electrostatic transfer arm. The curved-surface circuit 52 may have a uniform line width or different line widths, and may be a concave-surface static electricity circuit (not shown), a convex-surface static electricity circuit (as shown in FIG. 13), or an irregularly curved-surface static electricity circuit (not shown). The curved-surface circuit 52 may be made by screen printing, stencil printing, or spray coating, or simply be a ready-made circuit; in either case, the curved-surface circuit 52 should end up buried in the ceramic plate 51.

This embodiment is advantageous in that the curved-surface circuit solves the problem of uneven distribution of static electricity, thereby allowing the present invention to be used in various industries and be applied to semiconductor/non-conductor materials, flexible materials, ceramic materials, porous materials, smooth-surface materials, and so on.

[First Method for Making a Ceramic-Circuit Composite Structure]

One method for making the foregoing ceramic-circuit composite structure includes the following steps:

Step (a): Spray granulation is performed to produce spherical powder particles. More specifically, polyvinyl butyral (PVB) and a dispersant are added into and mixed with a composition of aluminum nitride/yttrium oxide/carbon, a composition of aluminum oxide/magnesium oxide, silicon nitride, silicon carbide, resin, a composite material of the above, or any insulating material, and the mixture is sprayed to form spherical powder particles, which are then rendered into a green body. The green body is molded by a high-pressure curved-surface mold or is first formed by high-pressure molding and then processed into a curved-surface green body.

Step (b): At least one curved-surface circuit is prepared on one side of the green body by printing, by spray coating, or by making use of a ready-made circuit. The circuit may have a uniform line width or different line widths. When a plurality of circuits are desired (as in the second to the fourth embodiments), this step further includes preparing the remaining circuit(s) (sequentially) on the same side of the green body by printing, by spray coating, or by making use of one or more ready-made circuits, with the additional circuit(s) lying above the at least one curved-surface circuit.

Step (c): The green body is subjected to high-pressure molding, followed optionally by cold isostatic pressing (CIP), such that an unsintered ceramic plate is obtained.

Step (d): The unsintered ceramic plate is subjected to debinding, sintering, and mechanical grinding to produce the ceramic-circuit composite structure, wherein the sintering may be atmospheric-pressure sintering, high-pressure sintering, or hydraulic-pressure sintering.

The method described above may further include step (e) of co-firing the ceramic-circuit composite structure and a pair of metal electrodes. If the ceramic-circuit composite structure includes a hollow ceramic tube (as in the first to the fourth embodiments), step (e) is carried out by adhesively bonding the hollow ceramic tube to the ceramic-circuit composite structure, placing the pair of metal electrodes into the hollow ceramic tube, and then joining the electrodes to the ceramic-circuit composite structure by co-firing.

[Second Method for Making a Ceramic-Circuit Composite Structure]

Another method for making the foregoing ceramic-circuit composite structure includes the following steps:

Step (a): To start with, a powder mixture slurry is prepared by mixing PVB and a dispersant into a composition of aluminum nitride/yttrium oxide/carbon, a composition of aluminum oxide/magnesium oxide, silicon nitride, silicon carbide, resin, a composite material of the above, or any insulating material. Then the slurry, which is composed of spherical powder particles, is shaped into a green body by tape casting.

Step (b): At least one curved-surface circuit is prepared on one side of the green body by printing, by spray coating, or by making use of a ready-made circuit. The circuit may have a uniform line width or different line widths. When a plurality of circuits are desired (as in the second to the fourth embodiments), this step further includes preparing the remaining circuit(s) (sequentially) on the same side of the green body by printing, by spray coating, or by making use of one or more ready-made circuits, with the additional circuit(s) lying above the at least one curved-surface circuit.

Step (c): The green body is subjected to lamination (through tape casting), followed by CIP or hydraulic pressing to produce an unsintered ceramic plate.

Step (d): The unsintered ceramic plate is subjected to debinding, sintering, and mechanical grinding to produce the ceramic-circuit composite structure, wherein the sintering may be atmospheric-pressure sintering, high-pressure sintering, or hydraulic-pressure sintering.

The method described above may further include step (e) of co-firing the ceramic-circuit composite structure and a pair of metal electrodes. If the ceramic-circuit composite structure includes a hollow ceramic tube (as in the first to the fourth embodiments), step (e) is carried out by adhesively bonding the hollow ceramic tube to the ceramic-circuit composite structure, placing the pair of metal electrodes into the hollow ceramic tube, and then joining the electrodes to the ceramic-circuit composite structure by co-firing.

According to the above, a conventional e-chuck or heating device for use in a manufacturing process generally includes a planar circuit, which has less static electricity or lower temperature at the center than in the peripheral region. By contrast, the present invention provides a ceramic-circuit composite structure with a curved-surface circuit to achieve uniform distribution of static electricity or temperature, thereby solving the prior art problem that a workpiece or wafer held by a conventional e-chuck or heated by a conventional heating device may be subjected to uneven force application or uneven heating. Moreover, the ceramic-circuit composite structure of the present invention may include a plasma control mesh or plasma control circuit in addition to a heating circuit and/or a static electricity circuit, the objective being to increase the plasma attraction of the plasma generator used in a manufacturing process.

The above is the detailed description of the present invention. However, the above is merely the preferred embodiment of the present invention and cannot be the limitation to the implement scope of the present invention, which means the variation and modification according to the present invention may still fall into the scope of the invention.

What is claimed is:

1. A ceramic-circuit composite structure, comprising:
   a ceramic plate;
   a curved-surface circuit buried in the ceramic plate, wherein the curved-surface circuit is a wavy curved-surface circuit; and
   a power supply module electrically connected to the curved-surface circuit;
   wherein the curved-surface circuit is an irregularly curved-surface heating circuit;
   wherein the ceramic-circuit composite structure further includes a static electricity circuit buried in the ceramic plate and lying above the curved-surface circuit, wherein the static electricity circuit is a wavy curved-surface circuit; and wherein the ceramic-circuit composite structure further includes a plasma control mesh or plasma control circuit buried in the ceramic plate and lying above the static electricity circuit.

2. The ceramic-circuit composite structure of claim 1, wherein the ceramic plate has a supporting surface that has a recessed supporting portion.

3. The ceramic-circuit composite structure of claim 1, wherein the ceramic-circuit composite structure further includes a hollow ceramic tube provided between the ceramic plate and the power supply module, and a pair of metal electrodes are provided in the hollow ceramic tube and are electrically connected to the curved-surface circuit and the power supply module.

4. The ceramic-circuit composite structure of claim 1, wherein the ceramic-circuit composite structure further includes a hollow ceramic tube provided between the ceramic plate and the power supply module, and a pair of metal electrodes are provided in the hollow ceramic tube and are electrically connected to the curved-surface circuit, the static electricity circuit, the plasma control mesh or plasma control circuit, and the power supply module.

5. The ceramic-circuit composite structure of claim 1, wherein the material of the ceramic plate is selected from a group composed of a composition of aluminum nitride/yttrium oxide/carbon, a composition of aluminum oxide/magnesium oxide, silicon nitride, silicon carbide, resin, a semiconductor material, and an insulating material.

6. The ceramic-circuit composite structure of claim 1, wherein the curved-surface circuit is made of a metal material or a conductive material.

7. The ceramic-circuit composite structure of claim 6, wherein the metal material is a combination of molybdenum, tungsten, nickel, titanium, and carbon.

8. A method for making the ceramic-circuit composite structure of claim 1 as follows:

in step (a), a green body composed of ceramic particles is provided, and the green body is molded by a high-pressure curved-surface mold or is processed into a curved-surface green body after being formed by high-pressure molding;

in step (b), at least one curved-surface circuit is prepared on one side of the green body by printing, by jet printing, by electronic printing, or by making use of a ready-made circuit;

in step (c), the green body is subjected to high-pressure molding to produce an unsintered ceramic plate; and in step (d), the unsintered ceramic plate is subjected to debinding, sintering, and grinding to produce the ceramic-circuit composite structure, wherein the sintering is atmospheric-pressure sintering, high-pressure sintering, or hydraulic-pressure sintering.

9. The method of claim 8, wherein the step (b) further includes providing a plasma control mesh or plasma control circuit above the at least one curved-surface circuit.

10. The method of claim 8, wherein the method further includes step (e), in which a hollow ceramic tube is adhesively bonded to the ceramic-circuit composite structure and then a pair of metal electrodes are disposed in the hollow ceramic tube and joined to the ceramic-circuit composite structure by co-firing.

11. A method for making the ceramic-circuit composite structure of claim 1, wherein the method includes the steps of:

(a) providing a green body that is composed of ceramic particles and shaped by tape casting;

(b) preparing at least one curved-surface circuit on one side of the green body by printing, by jet printing, by electronic printing, or by making use of a ready-made circuit;

(c) subjecting the green body to lamination through tape casting, followed by cold isostatic pressing or hydraulic pressing to produce an unsintered ceramic plate; and (d) debinding, sintering, and then grinding the unsintered ceramic plate to produce the ceramic-circuit composite structure, wherein the sintering may be atmospheric-pressure sintering, high-pressure sintering, or hydraulic-pressure sintering.

12. The method of claim 11, wherein the step (b) further includes providing a plasma control mesh or plasma control circuit above the at least one curved-surface circuit.

* * * * *